United States Patent
Nishimura et al.

(10) Patent No.: US 7,116,238 B2
(45) Date of Patent: Oct. 3, 2006

(54) ELECTRONIC APPARATUS AND FAN MODULE REPLACING METHOD

(75) Inventors: Fumio Nishimura, Nishitama-gun (JP); Mitsuyoshi Okawa, Akishima (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 911 days.

(21) Appl. No.: 09/812,786

(22) Filed: Mar. 15, 2001

(65) Prior Publication Data

US 2002/0067277 A1 Jun. 6, 2002

(30) Foreign Application Priority Data

Jun. 30, 2000 (JP) .................................... 2000-200134

(51) Int. Cl.
*G08B 21/00* (2006.01)

(52) U.S. Cl. .................... 340/635; 340/641; 361/687
(58) Field of Classification Search ............. 340/635, 340/641, 648, 687; 361/695, 687; 312/236
See application file for complete search history.

(56) References Cited

U.S. PATENT DOCUMENTS

| | | | | | |
|---|---|---|---|---|---|
| 5,287,009 | A | * | 2/1994 | Heung | 307/141 |
| 5,291,383 | A | * | 3/1994 | Oughton | 363/17 |
| 6,316,718 | B1 | * | 11/2001 | Lin | 174/17 VA |
| 6,526,333 | B1 | * | 2/2003 | Henderson et al. | 700/300 |

FOREIGN PATENT DOCUMENTS

JP 3-190191 8/1991

* cited by examiner

*Primary Examiner*—Daryl Pope
(74) *Attorney, Agent, or Firm*—Finnegan, Henderson, Farabow, Garrett & Dunner, L.L.P.

(57) ABSTRACT

An electronic apparatus capable of replacing a fan module during operation, includes a unit for instructing a replacement of a fan module, and a unit for controlling a fan drive voltage not to be supplied to a fan module to be replaced when the replacement is instructed.

8 Claims, 10 Drawing Sheets

US 7,116,238 B2

ELECTRONIC APPARATUS AND FAN MODULE REPLACING METHOD

CROSS-REFERENCE TO RELATED APPLICATIONS

This application is based upon and claims the benefit of priority from the prior Japanese Patent Application No. 2000-200134, filed Jun. 30, 2000, the entire contents of which are incorporated herein by reference.

BACKGROUND OF THE INVENTION

The present invention relates to an electronic apparatus and a fan module replacing method.

A hot swap facility has been used as a technique for replacing fan modules implementing redundancy during system operation in an electronic apparatus.

However, such a hot swap is performed on the large-current circuitry with maintaining a fan drive voltage. Thus, a connector mechanism flowing the large current results in a dedicated large-sized structure including an arrangement having sufficient distance between connection pins, a sufficient current capacity, and the like. Specifically, a back plane and large-sized connectors are provided as relay parts for the fan modules in the cabinet to assure the large current capacity.

Consequently, the prior art imposes great structural restrictions on the fan module mounting portions and requires many special parts with large and complicated structures. In addition, the electronic apparatus has become large, heavy, and costly because the cabinet needs a large installation space for the fan module mounting portions.

BRIEF SUMMARY OF THE INVENTION

Accordingly, it is an object of the present invention to provide an electronic apparatus and a fan module replacing method that are capable of safely and smoothly replacing a fan module during operation using a simple and economical configuration without the need for special parts having large current capacity for hot swapping.

According to one aspect of the present invention, there is provided a method of replacing a fan module during operation of an electronic apparatus, the method comprising the steps of: instructing a replacement of a fan module; and controlling a fan drive voltage not to be supplied to a fan module to be replaced when the replacement is instructed.

According to another aspect of the present invention, there is provided an electronic apparatus capable of replacing a fan module during operation, comprising: means for instructing a replacement of a fan module; and means for controlling a fan drive voltage not to be supplied to a fan module to be replaced when the replacement is instructed.

According to still another aspect of the present invention, there is provided an electronic apparatus capable of replacing a fan module during operation, comprising: a relay cable coupled to a fan module for transmitting the fan drive voltage and capable of being disconnected/connected from/to a fan module; means for instructing a replacement of a fan module; and means for controlling a fan drive voltage not to be supplied via the relay cable to a fan module to be replaced when the replacement is instructed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described in detail with reference to the accompanying drawings.

The embodiment adopts a server computer as an example of an electronic apparatus. For better understanding, the description provides the simplest configuration example adopting two cooling fan modules implementing redundancy. It is of course possible to adopt a configuration having a plurality of fan modules implementing redundancy.

Figure 1:
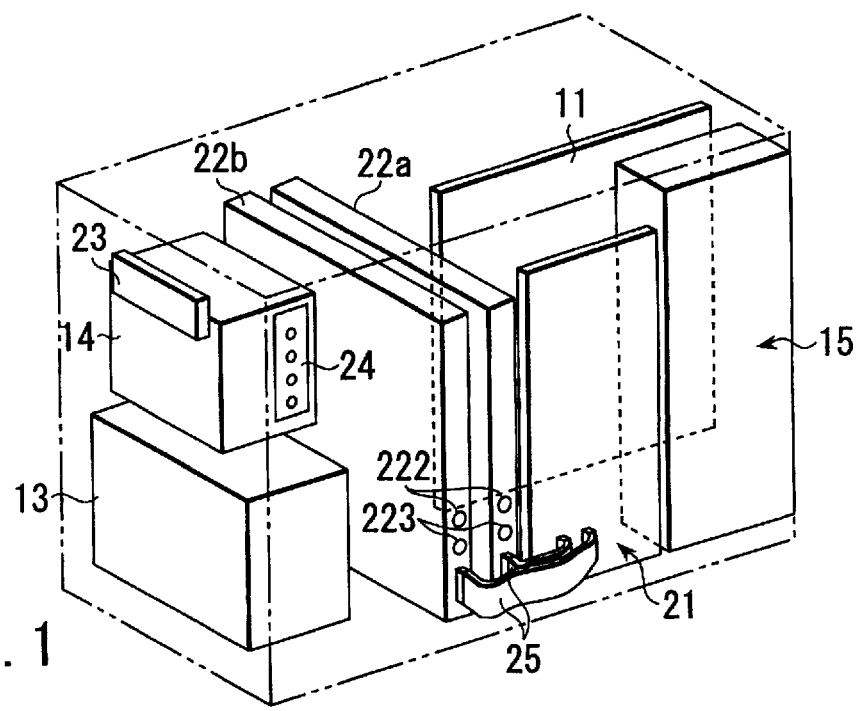
FIG. 1 is a perspective view showing the configuration of major sections for a server computer according to an embodiment of the present invention.
Figure 2:
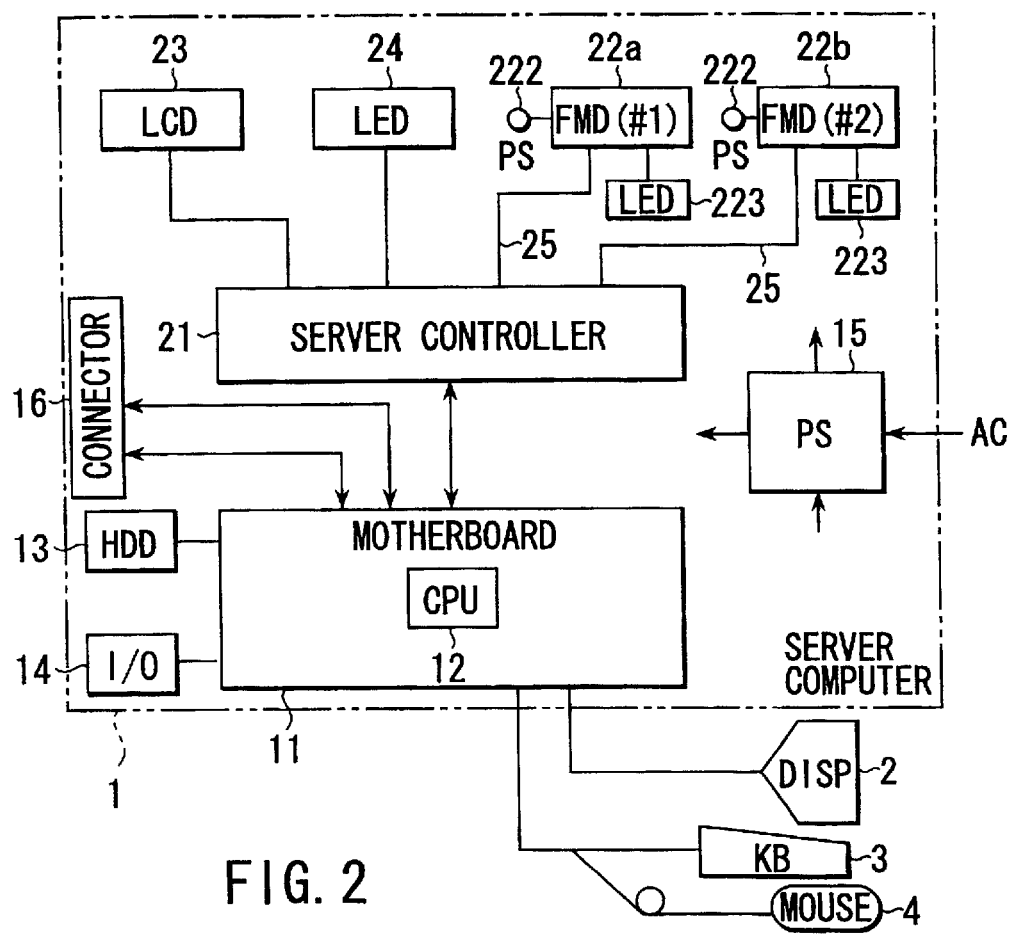
FIG. 2 is a block diagram showing the configuration of major sections for the server computer according to the same embodiment.

FIGS. 1 and 2 are a perspective view and a block diagram showing the configuration of major sections for a server computer according to an embodiment of the present invention. In both these figures, common elements are assigned same numerals.

In these figures, the reference numeral 1 represents a server computer. The reference numerals 2 to 4 (in FIG. 2) each represent man-machine interface facilities for the server computer 1. The reference numeral 2 represents a display unit. The reference numeral 3 represents a keyboard. The reference numeral 4 represents a pointing device such as a mouse.

The server computer 1 includes a motherboard 11, a CPU 12 (in FIG. 2) mounted on the motherboard 11, a hard disk drive 13 (in FIG. 2), an input/output device 14, a power supply unit 15, and a communication cable connector 16 (in FIG. 2) for connection with the external. Further, the server computer 1 includes a server controller 21, fan modules 22a and 22b implementing redundancy, a status display section (LCD) 23, a status display section (LED) 24, and a relay cable 25.

The motherboard 11 is mounted with a CPU 12 for controlling overall the operation of the server computer and with CPU peripheral circuit elements including memory modules (main memory, BIOS-ROM, and the like). The motherboard 11 is connected via a bus with the hard disk drive 13, the input/output device 14, a PCI card and the like. Various heat generating parts such as the CPU 12 mounted on the motherboard 11, the PCI card inserted into a card slot, and the like are the targets to be cooled by the fan modules 22a and 22b.

The hard disk drive 13 stores various programs and the like for implementing the server functions of the electronic apparatus under the control of the CPU 12 mounted on the motherboard 11.

The input/output device 14 includes various devices such as CD-ROM and a PC card drive.

The power supply unit 15 generates operating DC power to be supplied to each component in the computer 1 based on an external AC power input.

The server controller 21 distributes DC output from the power supply unit 15 and controls fan drive voltages for the fan modules 22a and 22b, for example. The controller performs drive voltage control processing during replacement of the fan modules 22a and 22b under firmware control from the microprocessor in a monitor control section (described later).

Of the fan modules 22a and 22b implementing redundancy, 22a is referred to as a first fan module (FMD (#1)) and 22b as a second fan module (FMD(#2)).

The status display section 23 (LCD) displays monitoring contents, device states, and the like with liquid crystal characters.

The status display section 24 (LED) externally notifies temperature anomalies, operational conditions, and the like in the device (cabinet) by activating or blinking an LED.

The relay cable 25 directly connects the fan modules 22a and 22b with the server controller 21, unlike the prior art. In this embodiment, there is no need to provide a hot swap facility for large current capacity. A direct cable connection is made between a relay unit (described later) in each of the fan modules 22a, 22b and a fan voltage control section (described later) in the server controller 21. This eliminates a need for an intermediate latch relay member such as a back plate.

Figure 3:
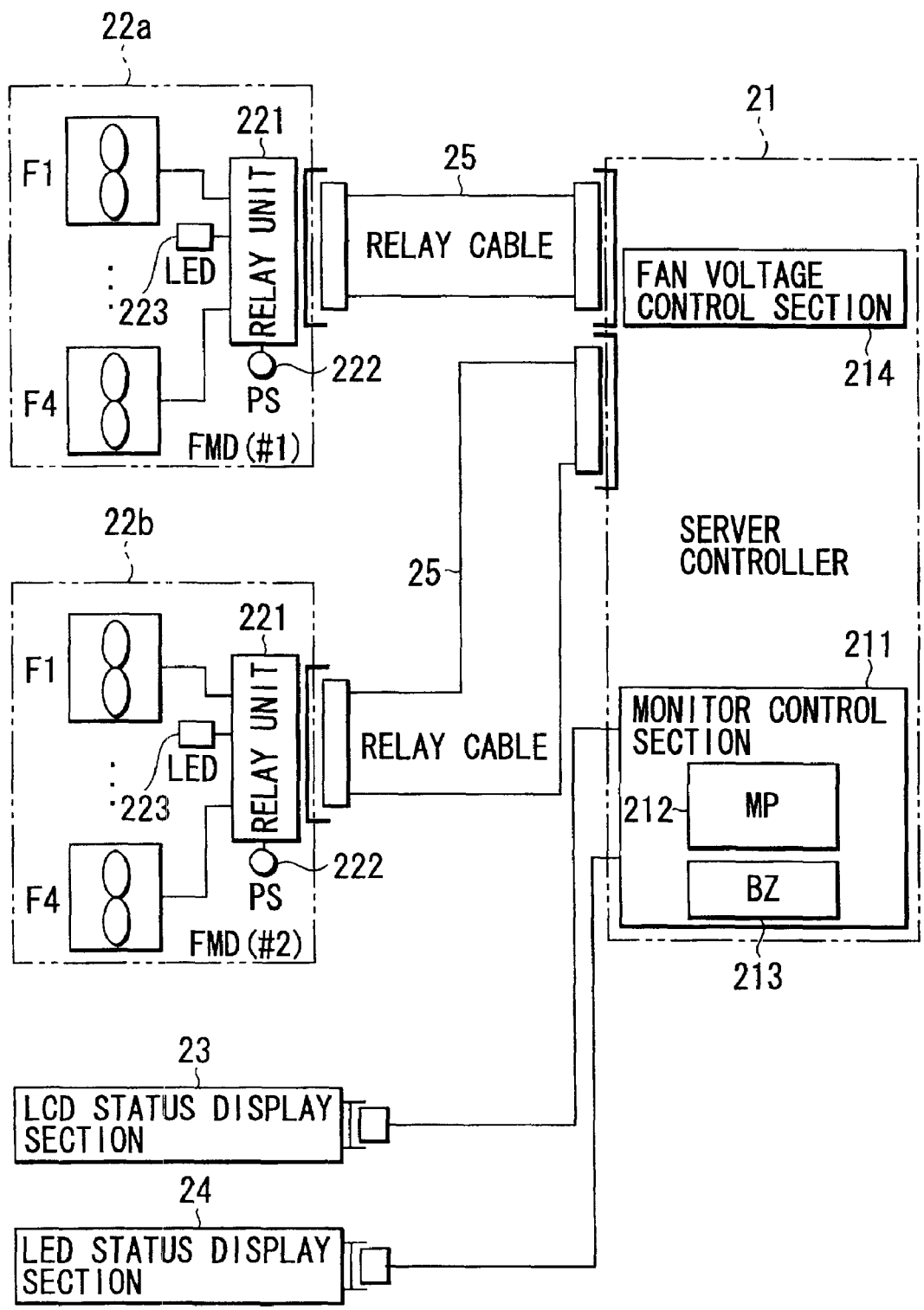
FIG. 3 is a block diagram showing connection between the server controller and fan modules according to the same embodiment.

FIG. 3 is a block diagram showing an internal configuration of the server controller 21 and the fan modules 22a and 22b shown in FIGS. 1 and 2 and connection among them.

The server controller 21 includes a monitor control section 211 for performing status monitoring/notification and a fan voltage control section 214 for distributing DC output from the power supply unit 15 (FIG. 2) and controlling the drive voltages of the fan modules 22a and 22b.

The monitor control section 211 in the server controller 21 monitors statuses of elements such as the fan modules 22a and 22b in the server computer 1 under firmware control of a microprocessor (MP) 212. When an error is detected, the monitor control section 211 outputs its content to the status display section 23 and the status display section 24 for indications. When a temperature anomaly occurs in the cabinet, for example, the monitor control section 211 externally notifies such an anomaly by sounding a buzzer (BZ) 213.

The fan voltage control section 214 in the server controller 21 controls drive voltages of the fan modules 22a and 22b as described. Specifically, the fan voltage control section 214 controls fan drive voltages for each of fan units F1 to F4 in the first fan module (FMD(#1)) 22a and the second fan module (FMD(#2)) 22b under firmware control of the microprocessor 212 in the monitor control section 211.

The first fan module (FMD(#1) 22a is a basic cooling fan module. This module contains a plurality of fan units F1 to F4, a relay unit 221 having fan connectors for connecting the fan units F1 to F4, a push switch 222 operated by an operator in the case where the operator wishes to replace a corresponding fan module, an operation state display section (LED) 223 having a light source. This module is installed in a fan module body structure 220 shown in FIG. 6. The relay unit 221 is connected to the server controller 21 via the relay cable 25. The fan units F1 to F4 are rotatively driven by DC drive power supplied from the fan voltage control section 214 in the server controller 21. Each fan unit uses three wires: a signal wire for the DC drive power, an alarm signal wire for notifying failures in its own unit, and a ground wire.

The second fan module (FMD(#2)) 22b is a redundant cooling fan module and has the same configuration as for the first fan module (FMD(#1)) 22a. For better understanding, this embodiment adopts only one redundant fan module. It is of course possible to adopt a configuration including a plurality of redundant fan modules.

As obvious from the above, since the relay cable 25 directly connects the fan modules 22a and 22b with the server controller 21, there is no need to provide a hot swap facility for large current capacity. Specifically, the direct cable connection is made between a relay unit 221 in each of the fan modules 22a, 22b and a fan voltage control section 214 in the server controller 21. This eliminates the need for an intermediate latch relay member such as a back plate.

Figure 4:
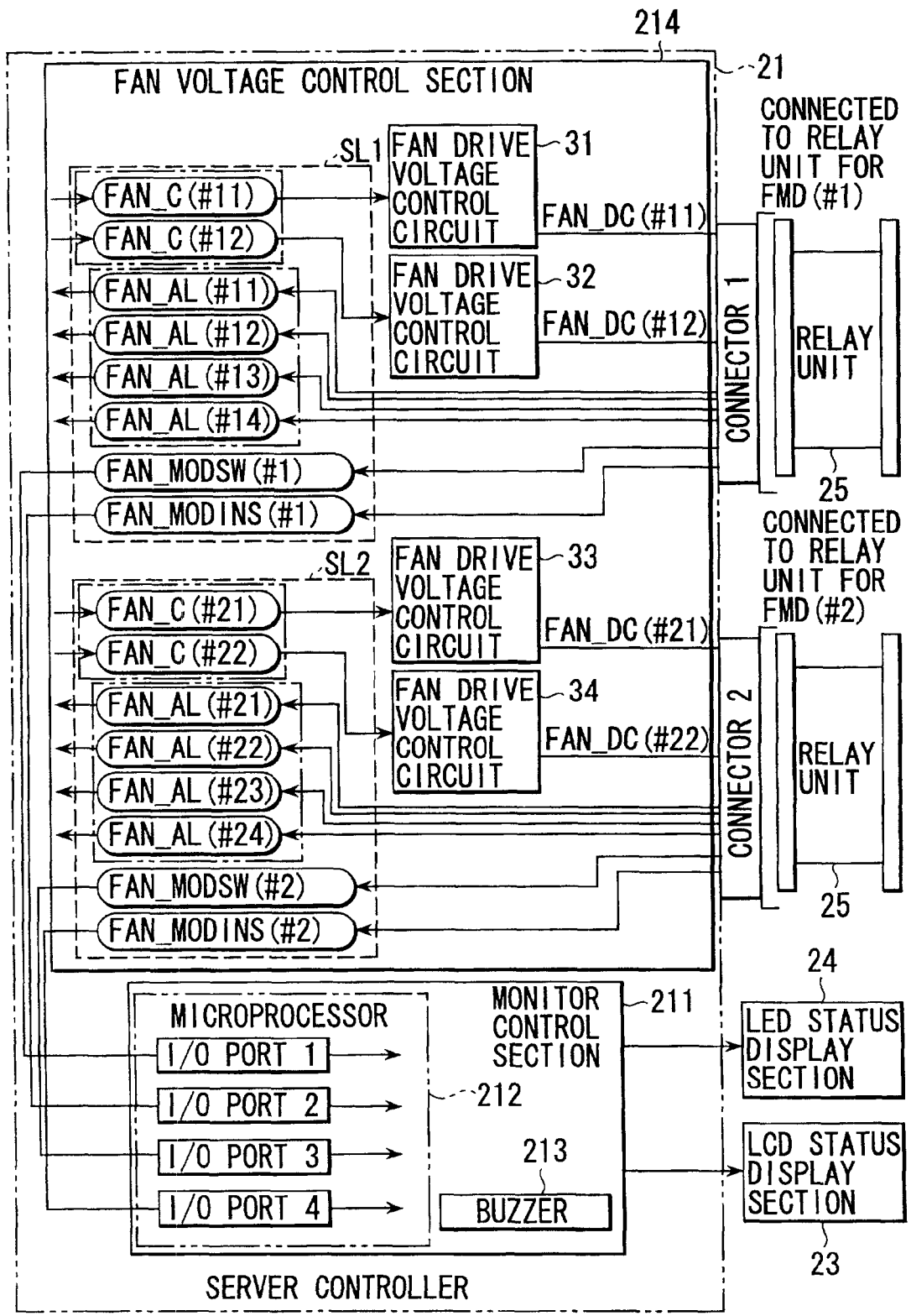
FIG. 4 is a block diagram showing the configuration of major circuitry inside the server controller according to the same embodiment.

FIG. 4 is a block diagram showing the configuration of major circuitry inside the server controller 21 shown in FIGS. 1 to 3.

Fan drive voltage control circuits 31 to 34 control fan drive voltages for the first fan module (FMD(#1)) 22a and the second fan module (FMD(#2)) 22b under the control of the microprocessor 212 in the monitor control section 211. The fan drive voltage control circuit 31 controls fan drive voltages for fan units F1 and F2 in the first fan module (FMD(#1)) 22a. The fan drive voltage control circuit 32 controls fan drive voltages for fan units F3 and F4 in the first fan module (FMD(#1)) 22a. The fan drive voltage control circuit 33 controls fan drive voltages for fan units F1 and F2 in the second fan module (FMD(#2)) 22b. The fan drive voltage control circuit 34 controls fan drive voltages for fan units F3 and F4 in the second fan module (FMD(#2)) 22b.

Each of the fan drive voltage control circuits 31 to 34 includes an ordinary digital to analog converter, operational amplifier, FET, and the like. Each fan drive voltage control circuit inputs a constant voltage and outputs a fan drive voltage in accordance with a specified value set in the built-in digital to analog converter. The value in the built-in digital to analog converter is specified by FAN_C signal (described later) supplied from the microprocessor 212.

Of signals processed in the fan voltage control section 214, the FAN_C(#) signal is a signal for specifying a value in the digital to analog converter for any of the fan drive voltage control circuits 31 to 34. In the notation FAN_C(#), ** denotes a voltage block number under control.

The FAN_AL(#) is an operation signal (fan alarm signal) output from the fan units F1 to F4 in any one of the fan modules 22a and 22b. In the notation FAN_AL(#), ** denotes a fan unit number.

The FAN_MODSW(#) is a fan module switch signal notifying a press of the push switch 222 for any one of the fan modules 22a and 22b. The FAN_MODSW(#) is input to I/O ports 1 and 3 of the microprocessor 212. When the switch is turned on (pressed), the firmware detects this state and stops supplying a fan drive voltage to the switch-operated fan module 22a/22b by setting this voltage to, e.g., 0V. This means removing a fan drive voltage supplied to the switch-operated fan module 22a/22b. In the notation FAN_MODSW(#),  denotes a fan module number for the operated push switch 222.

The FAN_MODINS(#) is a fan module installation signal detecting that any one of the fan modules 22a and 22b is connected (installed). The FAN_MODINS(#) is input to I/O ports 2 and 4 of the microprocessor 212. In the notation FAN_MODINS(#),  denotes a number of a fan module to be detected.

The FAN_DC(#) is a fan drive voltage supplied to any one of the fan modules 22a and 22b. In the notation FAN_DC(#), ** denotes a destination (any one of fan units (F1/F2) of FMD(#1), fan units (F3/F4) of FMD(#1), fan units (F1/F2) of FMD(#2), and fan units (F3/F4) of FMD(#2)) to which the fan drive voltage is supplied.

I/O ports 1 to 4 on the microprocessor 212 receive state signals of FAN_MODSW(#1), FAN_MODINS(#1), FAN_MODSW(#2), and FAN_MODINS(#2), respectively.

Figure 5:
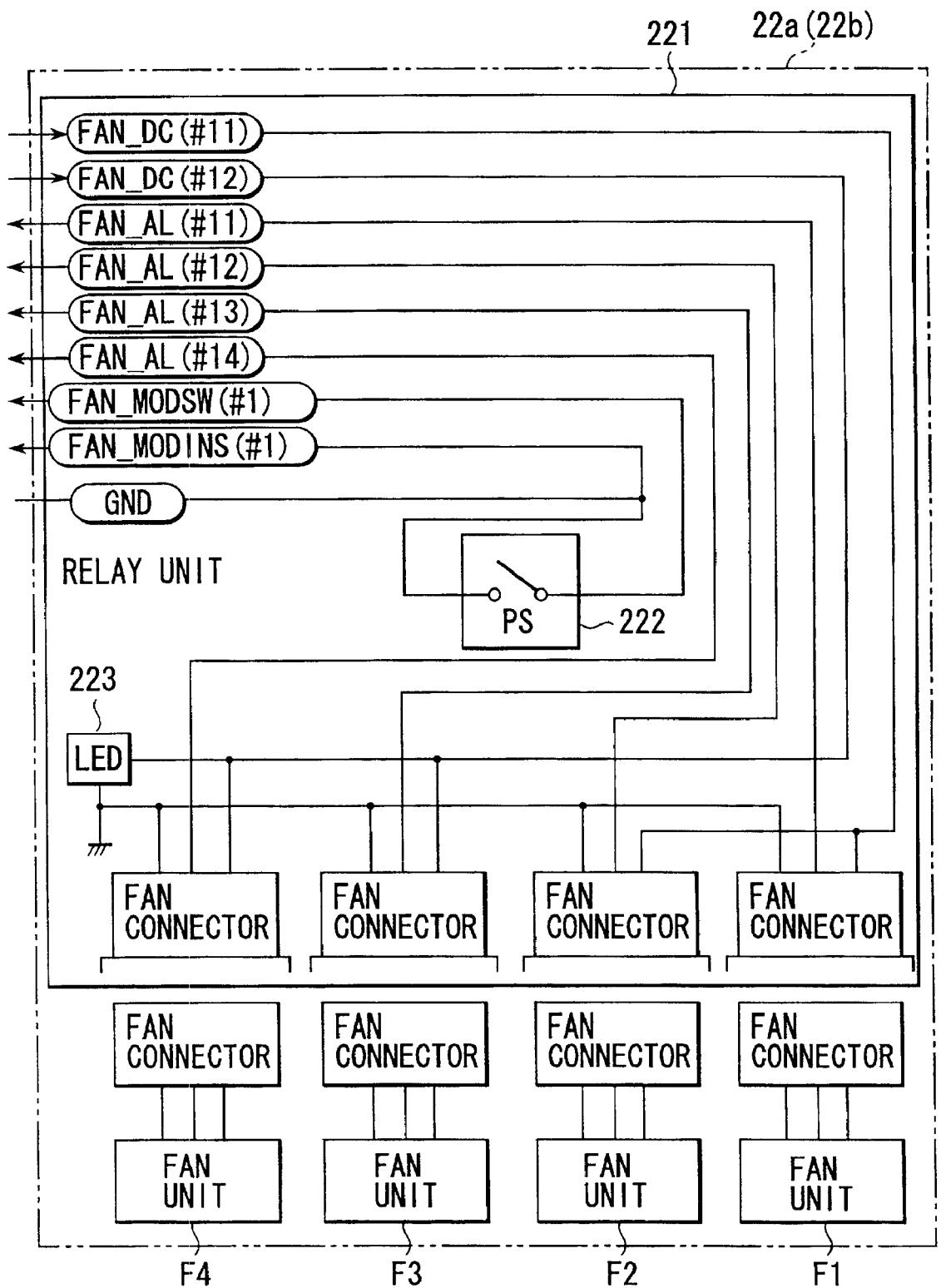
FIG. 5 is a block diagram showing the configuration of major circuitry inside the fan module according to the same embodiment.

FIG. 5 is a block diagram showing the configuration of major circuitry inside the fan modules 22a and 22b illustrated in FIGS. 1 to 3.

The push switch 222 enables or disables a fan module switch signal (FAN-MODSW(#**)) supplied from the server controller 21. Pressing or turning on the push switch 222 is notified to the corresponding I/O port on the microprocessor 212. Detecting this state, the firmware changes a value of the FAN_C signal for the pertinent fan module 22a/22b to "0", thus setting a fan drive voltage for that fan module to 0V.

The operation state display section (LED) 223 indicates an operation state of the fan module 22a/22b incorporated therein. When no fan drive voltage (0V) is supplied and the fan units F1 to F4 are inactive, a light of the operation state display section 223 is turned off. In this state, the fan module can be replaced.

Figure 6:
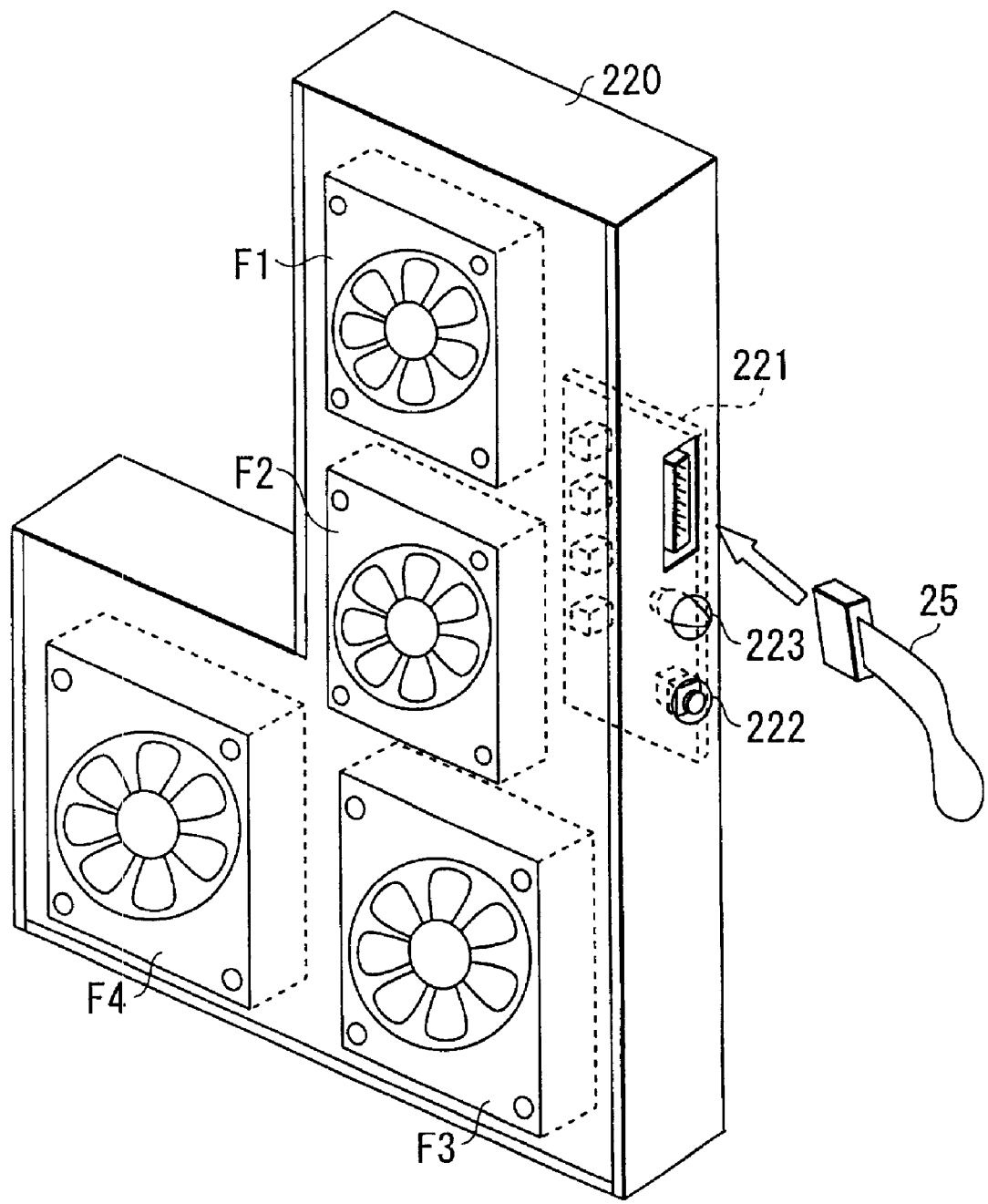
FIG. 6 is a perspective view showing a configuration example of the fan module according to the same embodiment.

FIG. 6 is a perspective view showing a configuration example of the fan modules 22a and 22b in FIGS. 1 to 3.

In this example, the fan module body structure 220 is equipped with the four fan units F1 to F4 and the relay unit 221. Externally exposed parts are the connector of the relay unit 221, the operation section of the push switch 222, and the operation state display section 223 having the light source.

Figure 7:
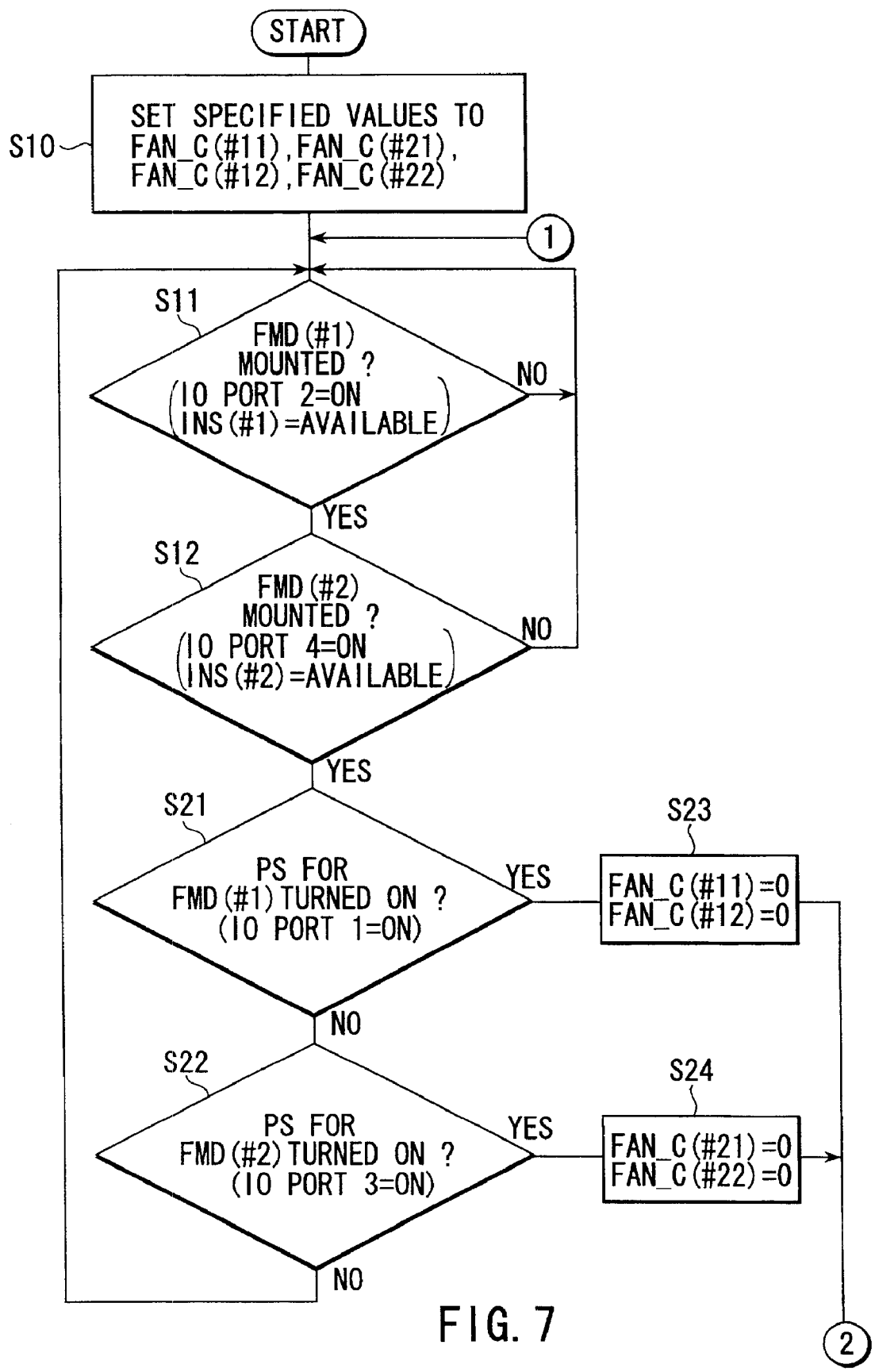
FIG. 7 is a flowchart showing part of an active fan module replacement procedure under firmware control of the server controller according to the same embodiment.
Figure 8:
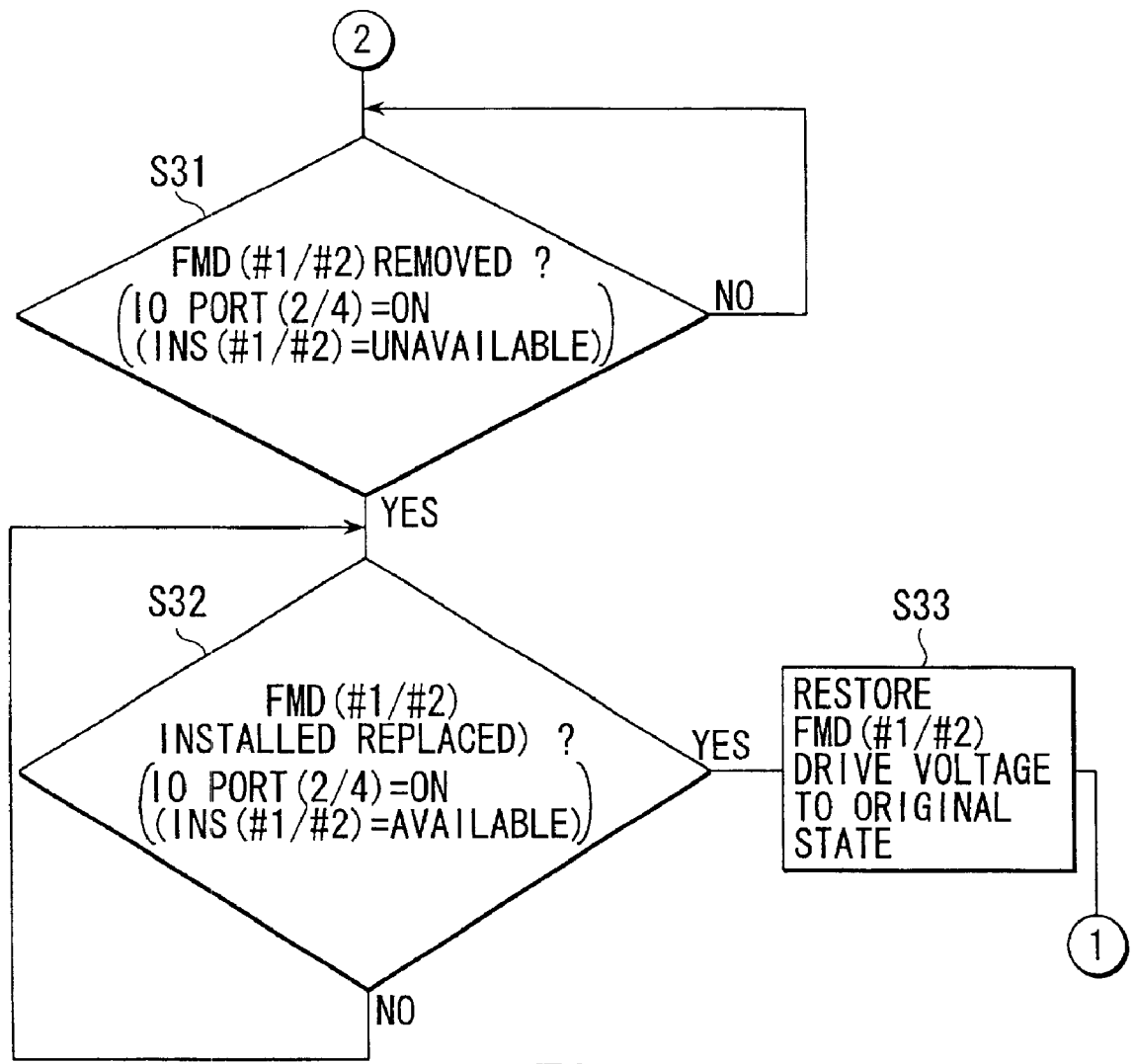
FIG. 8 is a flowchart showing part of an active fan module replacement procedure under firmware control of the server controller according to the same embodiment.

FIGS. 7 and 8 are flowcharts showing an active fan module replacement procedure under firmware control of the microprocessor 212 in the monitor control section 211 of the server controller 21. The following describes operations according to the embodiment of the present invention with reference to FIGS. 7 and 8.

While the server computer 1 operates, the monitor control section 211 of the server controller 21 monitors each component in the server controller 21 according to a specified monitoring routine under firmware control of the microprocessor 212. In particular, the monitor control section 211 performs the fan voltage control and the monitor control for the fan modules 22a and 22b.

At startup, initialization is performed in which specified values are set in the digital to analog converters in the fan drive voltage control circuits 31 to 34 on the fan voltage control section 214 in accordance with FAN_C signals (FAN_C(#11), FAN_C(#12), FAN_C(#21), FAN_C(#22)) (step S10 in FIG. 7). The fan drive voltage control circuits 31 to 34 then output the fan drive voltage (FAN-DC(#**)) according to the set values.

After the above initialization, the monitor control section 211 monitors each mount state of the fan modules 22a and 22b to check the establishment of redundancy and each operation state of the push switches 222 for the fan module 22a and 22b to detect a fan module replacement instruction.

That is, a mount state of the first fan module (FMD(#1)) 22a is checked by monitoring the FAN_MODINS(#1) signal supplied to the I/O port 2 (step S11), and a mount state of the first fan module (FMD(#2)) 22b is checked by monitoring the FAN_MODINS(#2) signal supplied to the I/O port 4 (step S12).

If both the first fan module (FMD(#1)) 22a and the second fan module (FMD(#2)) 22b are not mounted (installed), redundancy of the fan modules is not established. In this case, the above monitor routine (steps S11 and S12) is repeated until both the first fan module (FMD(#1)) 22a and the second fan module (FMD(#2)) 22b are mounted (installed).

If the first fan module (FMD(#1)) 22a is mounted (i.e., a value of FAN_MODINS(#1) on I/O port 2 indicates "0" (available)) and the second fan module (FMD(#2)) 22b is mounted (i.e., a value of FAN_MODINS(#2) on I/O port 4 indicates "0" (available)), redundancy of the fan modules is established.

Thereafter, an operation state of the push switch 222 for the first fan module (FMD(#1)) 22a is checked by monitoring the FAN_MODSW(#1) signal supplied to the I/O port 1 (step S21), and an operation state of the push switch 222 for the second fan module (FMD(#2)) 22b is checked by monitoring the FAN_MODSW(#2) signal supplied to the I/O port 3 (step S22).

When the push switch 222 for the first fan module (FMD(#1)) 22a is turned on, values of all FAN_C signals (FAN_C(#11) and FAN_C(#12)) for the fan module (FMD(#1)) 22a are changed to "0" (step S23). Consequently, the FAN_DC(#11) and FAN_DC(#12) for this module are set to 0V and the fan drive voltage is prevented from being supplied to the first fan module (FMD(#1)) 22a, with the result that the fan units F1 to F4 for the fan module (FMD(#1)) 22a is stopped to be driven.

Because the FAN_DC(#11) and FAN_DC(#12) are set to 0V, the light source of the operation state display section 223 is turned off, thereby externally notifying an operator that it is possible to replace the fan module (FMD(#1)) 22a.

On the other hand, when the push switch 222 for the second fan module (FMD(#2)) 22b is turned on, all FAN_C signals (FAN_C(#21) and FAN_C(#22)) for the fan module (FMD(#2)) 22b are changed to a value of "0" (step S24). Consequently, the FAN_DC(#21) and FAN_DC(#22) for this module are set to 0V and the fan drive voltage is prevented from being supplied to the first fan module (FMD(#1)) 22a, with the result that the fan units F1 to F4 for the fan module (FMD(#2)) 22b is stopped to be driven.

Like the above case, because the FAN_DC(#21) and FAN_DC(#22) are set to 0V, the light source of the operation state display section 223 is turned off, thereby externally notifying an operator that it is possible to replace the fan module (FMD(#2)) 22b.

The microprocessor 212 starts a timer count operation at the time the FAN_DC is set to 0V using a timer incorporated in the microprocessor 212. When the timer count value reaches a specified limit value, the microprocessor 212 performs a process of alerting an operator by sounding the buzzer 213, displaying a message on the status display section (LCD) 23, or the like. Thus, it is possible to avoid a situation where a fan module is not replaced for a long time and the system suffers a thermal damage or heavy load due to the lack of the fan module to be replaced.

Thereafter, any removal of the fan module (FMD(#1)) 22a and the fan module (FMD(#2)) 22b (i.e., disconnection of the fan module (FMD(#1)) 22a and the fan module (FMD(#2)) 22b from the relay cable 25) is checked by monitoring the FAN_MODINS(#1/#2) signals supplied to the I/O ports 2 and 4 (step S31 in FIG. 8). The monitoring for the removal is continued until one of the fan module (FMD(#1)) 22a and the fan module (FMD(#2)) 22b is disconnected from the relay cable 25.

If one of the first and second fan modules (FMD(#1/#2)) is removed (i.e., one of values of FAN_MODINS(#1/#2) on I/O ports 2 and 4 is changed to "1" (unavailable)), the process enters a routine for monitoring completion of the installation (replacement) for the removed fan module (step S32).

When one of the fan module (FMD(#1)) 22a and the fan module (FMD(#2)) 22b to be replaced is connected to the relay cable 25, a value of the FAN-MODINS signal is changed to "0" from "1". In response to this signal change, a completion of the fan module replacement is detected and the fan drive voltage to be supplied to the fan module 22a/22b is set to the original state and the corresponding light source of the operation state display section 223 is turned on (step S33).

In the above procedure, it is possible to omit step S11 in the case where the fan module (FMD(#1)) 22a is fixedly mounted and the fan module (FMD(#1)) 22a is removably mounted, for example.

The technique of above-described embodiment allows the fan module 22a/22b to be safely and smoothly replaced during operation using a simple and economical configuration without requiring special parts having large current capacity for hot swapping.

In particular, the above-described embodiment uses the push switch 222 for fan module replacement in the relay unit 221 in each of the fan modules 22a and 22b, so that it is possible to set the fan drive voltage for the corresponding fan module to 0V before removal of the fan module. Thus, a fan module can be safely and smoothly replaced during system operations by merely connecting/disconnecting the ordinary relay cable 25 to/from the fan module.

Further, it is possible to use a low-current small connector instead of large current hot-swap connectors. It is further possible to provide small, light-weight, and low-priced device because there is no need for a hot swap facility having large current capacity and low-priced and small parts can be used.

Further, the above-described embodiment provides a technique of monitoring a time period of state where the fan module is being disconnected during the replacement and alerting an operator when a timer count value reaches a specified limit value, thereby making it possible to avoid a situation where a fan module is not replaced for a long time and the system suffers a thermal damage or heavy load due to the lack of the fan module to be replaced.

The above-described embodiment shows the case where two fan modules implement redundancy. However, the present invention is not limited to this case. It is possible to adopt a plurality of fan modules implementing redundancy. In this case, it is preferable to adopt an active fan module replacement procedure under firmware control of the microprocessor 212 as shown in FIGS. 9 and 10.

Figure 9:
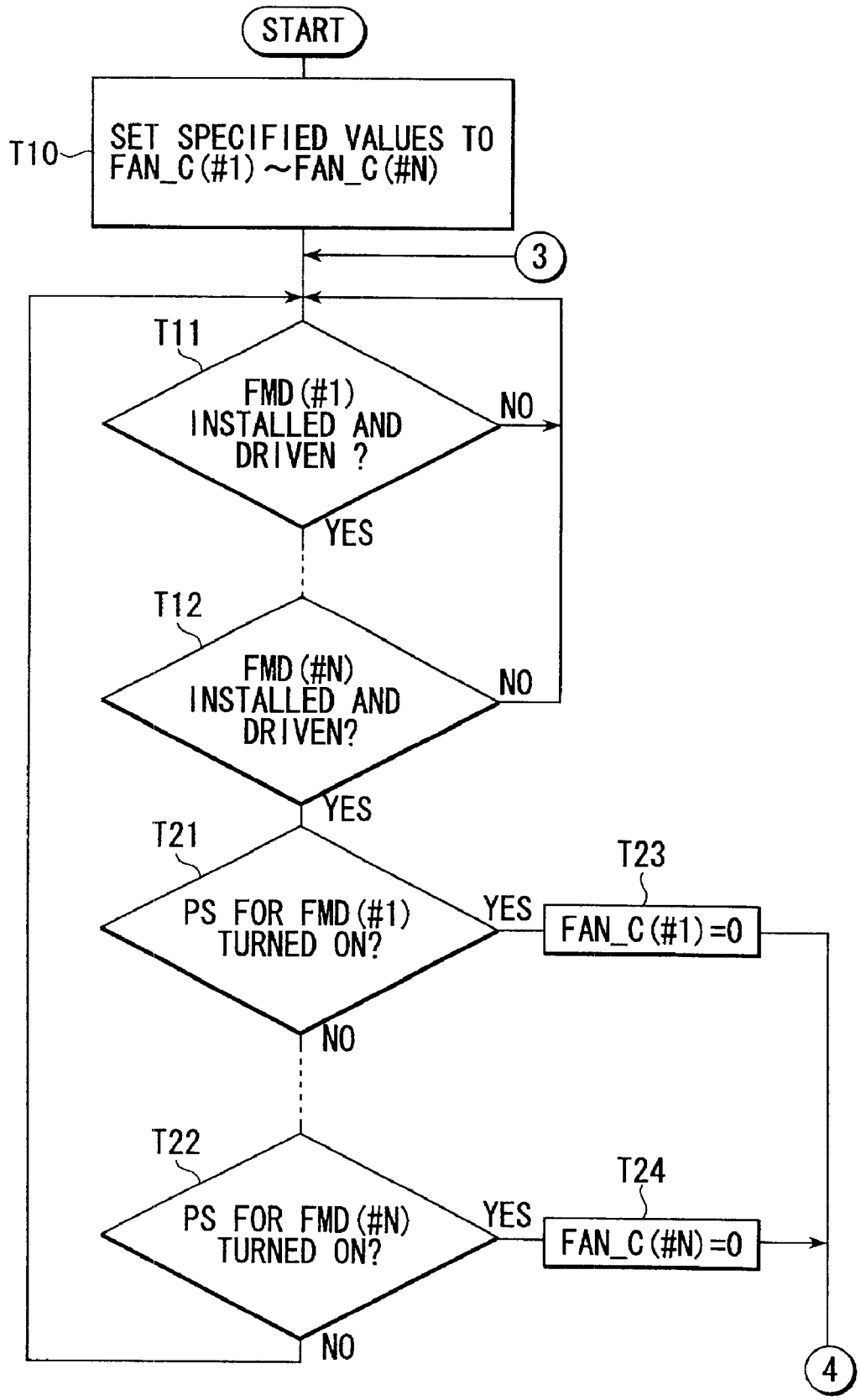
FIG. 9 is a flowchart showing part of an active fan module replacement procedure under firmware control of the server controller according to a modification of the above embodiment.
Figure 10:
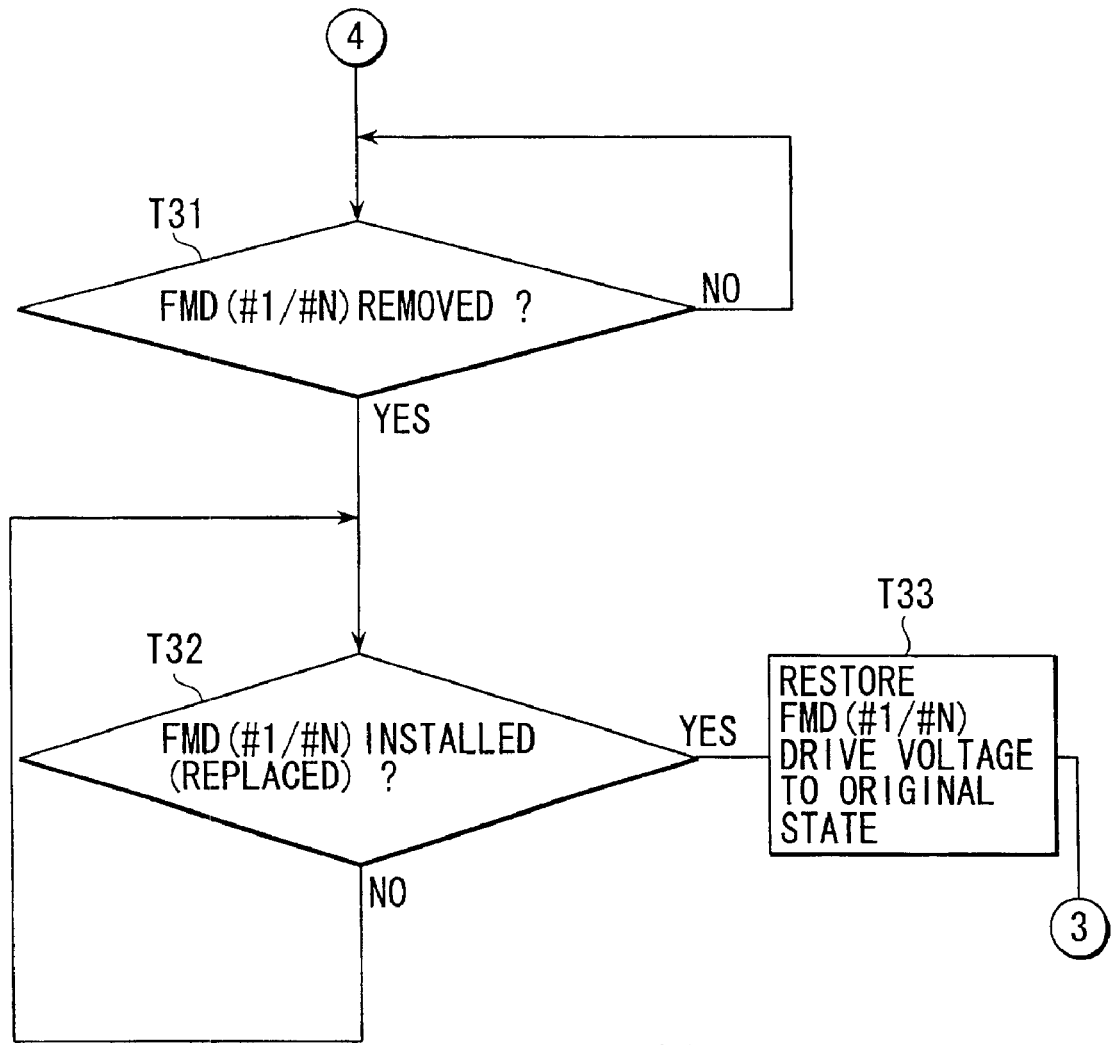
FIG. 10 is a flowchart showing part of an active fan module replacement procedure under firmware control of the server controller according to the modification of the above embodiment.

The example in FIGS. 9 and 10 assume the use of an N number of fan modules (FMD(#1) to FMD(#N)) implementing redundancy. For these fan modules (FMD(#1) to FMD(#N)), an N number of FAN_C (FAN_C(#1) to FAN_C(#N)) signals for specifying values in built-in digital to analog converters are provided, respectively.

At startup, initialization is performed in which specified values are set in the digital to analog converters in the fan drive voltage control circuits in accordance with FAN_C signals (FAN_C(#1) to FAN_C(#N)) (step T10 in FIG. 9). The fan drive voltage control circuits then output the fan drive voltage according to the specified values.

After the above initialization, the monitor control section 211 monitors a mount state (installed state) and a driven state of each of the fan modules (FMD(#1) to FMD(#N)) (T11 to T12).

If the system is not in a condition where all of the fan modules are installed (mounted) and driven, the above monitor routine (steps T11 to T12) is repeated.

When the system is in a condition where all of the fan modules are installed and driven (YES of step T12), the redundancy can be maintained even if one of the fan modules is removed. In other words, before removing a fan module, it is confirmed that whether the other fan modules has been installed and driven by steps T11 to T12.

When the push switch 222 for one of the fan modules (FMD(#1) to FMD(#N)) is turned on, a value of corresponding one of FAN_C(#1) to FAN_C(#N) signals is changed to "0" (T23 to T24). Consequently, the fan drive voltage for a corresponding module (to be replaced) is set to 0V and thus prevented from being supplied to the corresponding fan module.

Because the corresponding FAN_DC are set to 0V, the light source of the operation state display section 223 is turned off, thereby externally notifying an operator that it is possible to replace the corresponding fan module.

The microprocessor 212 starts a timer count operation at the time the FAN_DC is set to 0V using a timer incorporated in the microprocessor 212. When the timer count value reaches a specified limit value, the microprocessor 212 performs a process of alerting an operator by sounding the buzzer 213, displaying a message on the status display section (LCD) 23, or the like. Thus, it is possible to avoid a situation where a fan module is not replaced for a long time and the system suffers a thermal damage or heavy load due to the lack of the fan module to be replaced.

Thereafter, any removal of the fan modules (FMD(#1) to FMD(#N)) (i.e., disconnection of the fan modules (FMD (#1) to FMD(#N)) from the relay cable 25) is checked (step T31 in FIG. 10). The monitoring for the removal is continued until one of the fan modules (FMD(#1) to FMD(#N)) is disconnected from the relay cable 25.

If one of the fan modules (FMD)(#1) to FMD(#N)) is removed, the process enters a routine for monitoring completion of the installation (replacement) for the removed fan module (step T32).

When one of the fan modules (FMD(#1) to FMD(#N)) to be replaced is connected to the relay cable 25, a completion of the fan module replacement is detected and the fan drive voltage to be supplied to the replaced fan module is set to the original state and the corresponding light source of the operation state display section 223 is turned on (step T33).

According to the above procedure, before removing a fan module, it is confirmed that whether the other fan modules has been installed and driven, with the result that redundancy is safely maintained while the fan module is removed.

In the above-described embodiment, the push switch 222 is independently given to each of the fan modules for instructing replacement of the pertinent. The following describes an example of another module replacement instruction with reference to FIGS. 11 and 12.

Figure 11:
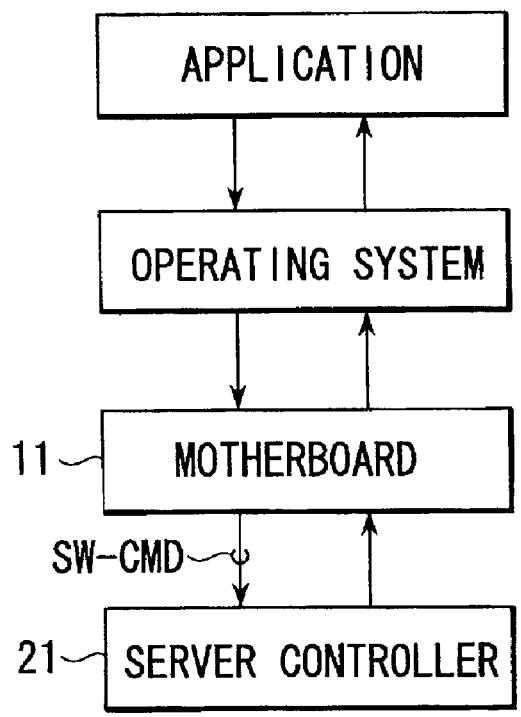
FIG. 11 shows a flow of commands for implementing a replacement instruction for a fan module by issuing a command from software according to the modification of the above embodiment.
Figure 12:
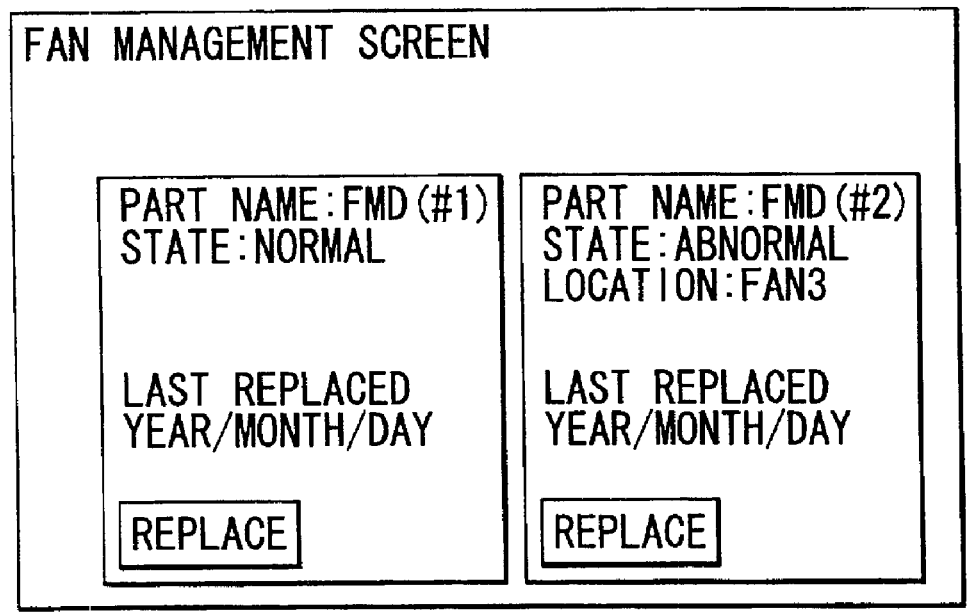
FIG. 12 shows a configuration example of an operation screen for implementing a replacement instruction for a fan module by issuing a command from software in FIG. 11.

When the CPU 12 is mounted on the motherboard 11, application software runs on an operating system (OS) and application software commands can be sent to or received from the OS as shown in FIG. 11. The server controller 21 is provided with a path for exchanging commands with the motherboard 11. The use of this path allows an application or the operating system to perform replacement instruction operations without use of the push switch 222 for the fan modules. FIG. 12 shows a configuration example of an operation screen for implementing a replacement instruction for the fan module by issuing a command from the software. This example provides each of the fan modules 22a and 22b with a management screen and displays a "REPLACE" button in the screen. This button can be manipulated or clicked by means of a pointing device such as a mouse. Clicking this button issues a replacement instruction command (SW-CMD) for one of the fan modules 22a and 22b to the server controller 21 via the motherboard 11. This enables the fan module replacement processing, like the case where the push switches 222 are used.

The above-described embodiment shows the case where each fan module has a plurality of fan units. However, the present invention is not limited to this case. For example, it is possible to adopt a single fan unit for each fan module.

Further, the above-described embodiment shows the case where an electronic apparatus is a server computer. However, the present invention is not limited to this case. It is possible to adopt an electronic apparatus other than the server computer.

As described above in detail, the present invention can provide an electronic apparatus and a fan module replacing method that are capable of safely and smoothly replacing a fan module during operation using a simple and economical configuration without the need for special parts having large current capacity for hot swapping.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of replacing a fan module during operation of an electronic apparatus, said method comprising the steps of:

instructing a replacement of the fan module;

controlling a fan drive voltage supplied to the fan module;

turning off the fan drive voltage when the replacement is instructed; and confirming a state where a plurality of fan modules are installed, wherein the controlling step includes the step of controlling the fan drive voltage supplied to a fan module to be replaced if the replacement of a fan module is instructed during the state where the plurality of fan modules are installed.

2. A method of replacing a fan module during operation of an electronic apparatus, said method comprising the steps of:

instructing a replacement of the fan module;

controlling a fan drive voltage supplied to the fan module;

turning off the fan drive voltage when the replacement is instructed;

starting a timer count operation at a time when the fan drive voltage supplied to a fan module is controlled; and alerting an operator when a timer count value of the time count operation reaches a specified value.

3. An electronic apparatus capable of replacing a fan module during operation, comprising:

means for instructing a replacement of the fan module;

means for controlling a fan drive voltage that turns off the fan drive voltage supplied to a fan module to be replaced when the replacement is instructed; and means for detecting a state where a plurality of fan modules is installed, wherein the controlling means includes means for controlling the fan drive voltage supplied to a fan module to be replaced if the replacement of a fan module is instructed during the state where the plurality of fan modules are installed.

4. The apparatus according to claim 3, wherein the plurality of fan modules implement redundancy.

5. An electronic apparatus capable of replacing a fan module during operation, comprising:

means for instructing a replacement of the fan module;

means for controlling a fan drive voltage that turns off the fan drive voltage supplied to the fan module to be replaced when the replacement is instructed;

means for starting a timer count operation at a time when the fan drive voltage supplied to a fan module to be replaced is controlled; and means for alerting an operator when a timer count value of the timer count operation reaches a specified value.

6. An electronic apparatus capable of replacing a fan module during operation, comprising:

means for instructing a replacement of the fan module;

means for controlling a fan drive voltage that turns off the fan drive voltage supplied to the fan module to be replaced when the replacement is instructed; and means for indicating that the replacement is possible after the fan drive voltage supplied to a fan module to be replaced is controlled.

7. An electronic apparatus capable of replacing a fan module during operation, comprising:

a relay cable coupled to the fan module for transmitting a fan drive voltage and capable of being disconnected from or connected or to the fan module;

means for instructing a replacement of the fan module;

means for controlling a fan drive voltage via the relay cable that turns off the fan drive voltage supplied to the fan module to be replaced when the replacement is instructed; and means for detecting a state where a plurality of fan modules is installed, wherein the controlling means includes means for controlling the fan drive voltage supplied to a fan module to be replaced if the replacement of a fan module is instructed during the state where the plurality of fan modules are installed.

8. An electronic apparatus capable of replacing a fan module during operation, comprising:

a relay cable coupled to the fan module for transmitting a fan drive voltage and capable of being disconnected from or connected to the fan module;

means for instructing a replacement of the fan module;

means for controlling a fan drive voltage via the relay cable that turns off the fan drive voltage supplied to the fan module to be replaced when the replacement is instructed;

means for starting a timer count operation at a time when the fan drive voltage supplied to a fan module to be replaced is controlled; and means for alerting an operator when a timer count value of the timer count operation reaches a specified value.

\* \* \* \* \*